(12) United States Patent
Naito (10) Patent No.: US 10,083,780 B2
(45) Date of Patent: Sep. 25, 2018

(54) SURFACE MOUNT RESISTOR

(71) Applicant: KOA CORPORATION, Ina-shi, Nagano (JP)

(72) Inventor: Takashi Naito, Nagano (JP)

(73) Assignee: KOA CORPORATION, Ina-Shi, Nagano (JP)

(*) Notice: Subject to any disclaimer, the term of this patent is extended or adjusted under 35 U.S.C. 154(b) by 13 days.

(21) Appl. No.: 15/593,795

(22) Filed: May 12, 2017

(65) Prior Publication Data

US 2018/0160538 A1    Jun. 7, 2018

(30) Foreign Application Priority Data

Mar. 24, 2016   (JP) .................................. 2016-060593

(51) Int. Cl.
| | |
|---|---|
| *H01C 1/02* | (2006.01) |
| *H01C 1/14* | (2006.01) |
| *H01C 1/014* | (2006.01) |
| *H01C 3/14* | (2006.01) |
| *H01C 7/00* | (2006.01) |
| *H01C 1/028* | (2006.01) |
| *H01C 1/16* | (2006.01) |
| *H05K 1/11* | (2006.01) |
| *H05K 1/18* | (2006.01) |

(52) U.S. Cl.
CPC ............... *H01C 1/02* (2013.01); *H01C 1/014* (2013.01); *H01C 1/028* (2013.01); *H01C 1/14* (2013.01); *H01C 1/16* (2013.01); *H01C 3/14* (2013.01); *H01C 7/003* (2013.01); *H05K 1/111* (2013.01); *H05K 1/181* (2013.01); *H05K 2201/10022* (2013.01)

(58) Field of Classification Search
CPC ............. H01C 1/02; H01C 3/16; H01C 10/46
See application file for complete search history.

(56) References Cited

U.S. PATENT DOCUMENTS

| | | | | |
|---|---|---|---|---|
| 4,934,048 A | * | 6/1990 | McElheny | ............ H01F 27/292 29/25.42 |
| 5,252,944 A | * | 10/1993 | Caddock, Jr. | .......... H01C 1/084 257/675 |
| 5,844,761 A | * | 12/1998 | Place, IV | ............. H01H 85/048 361/104 |
| 5,888,102 A | * | 3/1999 | Strickland | .............. H05K 3/301 361/809 |
| 9,398,701 B2 | * | 7/2016 | Haisler | .................. H05K 3/301 |

FOREIGN PATENT DOCUMENTS

| | | |
|---|---|---|
| JP | H08-017602 A | 1/1996 |
| JP | H08-088103 A | 4/1996 |

* cited by examiner

*Primary Examiner* — Jeremy C Norris
(74) *Attorney, Agent, or Firm* — Brinks Gilson & Lione (57) ABSTRACT

Provided is a surface mount resistor that can be stably mounted without the need for lead wires to be to flattened. The surface mount resistor includes a first resistive element and a second resistive element arranged in parallel, the first resistive element having first lead wires at opposite ends thereof, and the second resistive element having second lead wires at opposite ends thereof. The first resistive element and the second resistive element are integrated by being covered with a sheath. The first lead wires and the second lead wires are arranged such that they protrude outward in a direction of an axis beyond the sheath. The first lead wires and the second lead wires are bent alongside surfaces and a bottom surface of the sheath.

8 Claims, 10 Drawing Sheets

SURFACE MOUNT RESISTOR

RELATED APPLICATIONS

The present application claims priority from Japanese patent application JP 2016-060593 filed on Mar. 24, 2016, the content of which is hereby incorporated by reference into this application.

BACKGROUND OF THE INVENTION

1. Field of the Invention

The present disclosure relates to a surface mount resistor with lead wires.

2. Description of the Related Art

As a surface mount resistor mounted on the surface of a printed board or the like, the following techniques are known, for example.

For example, Patent Document 1 below discloses an electronic component with a configuration in which lead wires, which are lead out from opposite ends of a cylindrical electronic component element 1 and have squashed planar portions at their tip ends, are lead out from opposite ends of a case and are bent so that the case and the lead wires become flush with each other at the bottom portion of the case, thus forming electrode portions. In addition, a configuration in which such a cylindrical electronic component element is covered with rectangular molding resin is also disclosed.

Patent Document 2 discloses a surface mount electronic component that includes a cylindrical electronic component and a rectangular parallelepiped-shaped case with a cylindrical through-hole, the component having a configuration in which lead wires lead out from opposite ends of the case are allowed to enter a groove at the bottom portion of the case and are bent so as to become flush therewith, thus forming electrode portions. Since a groove for housing therein the tip ends of the bent lead wires is provided at the bottom portion of the case, high stability is provided and the terminal portions are prevented from floating, and further, positional deviation against lateral force can be provided.

3. Related Art Documents

Patent Document 1: JP H08-017602 A
Patent Document 2: JP H08-088103 A

SUMMARY OF THE INVENTION

In order to use lead wires for connection to the outside, in a conventional rectangular resistor with lead terminals, if linear lead wires are just attempted to be mounted by being bent toward the mount surface side, the lead wires will be likely to slip on the surface and thus become unstable. In order to stabilize such lead wires, it has been necessary to provide a structure in which the lead wires are partially squashed as described in Patent Document 1 above or a structure in which a recessed portion is provided in a part of the bottom surface of a component so as to house the lead wires therein, as described in Patent Document 2 above, for example.

However, if the lead wires are squashed, if the squashing is performed obliquely even slightly, the terminals will have variations in the heights. Therefore, high accuracy is required of the squashing positions, which makes the production steps complex. Further, even when flat terminals are used, it is necessary to use a dedicated welding machine for welding plate-form electrodes.

It is an object of the present disclosure to provide a surface mount resistor that can be mounted stably without the need for lead wires to be flattened.

According to an aspect of the present disclosure, there is provided a surface mount resistor including a first resistive element and a second resistive element arranged in parallel, the first resistive element having first lead wires at opposite ends thereof, and the second resistive element having second lead wires at opposite ends thereof, in which the first resistive element and the second resistive element are integrated by a sheath, the first lead wires and the second lead wires are arranged such that the lead wires protrude outward in a direction of an axis beyond the sheath, and the first lead wires and the second lead wires are bent alongside surfaces and a bottom surface of the sheath.

Accordingly, the surface mount resistor is supported by at least two lead wires from the opposite ends thereof, that is, a total of four lead wires when mounted. Therefore, stable connection is achieved.

It should be noted that the above case also includes cases where three or more resistive elements are used. In addition, such elements include (an)other element(s) and an element(s) used in combination with the resistive element.

It is preferable that a lead wire housing portion be formed on the bottom surface of the sheath, the lead wire housing portion being adapted to house the first lead wires and the second lead wires therein.

The lead wire housing portion may have a sloped portion that is sloped from an end surface toward a center of the sheath so that the first lead wires and the second lead wires are bent along the sloped portion.

With the recessed portion formed by the sloped portion, the lead wires to be bent toward the bottom surface side can be bent more inward, which can increase the mounting stability. In addition, a projecting portion, which is formed at the center of the bottom surface as the recessed portion is formed, increases the mounting stability and also prevents short-circuit between the lead wires.

The first lead wires and the second lead wires are preferably housed in the housing portion, and connected at points to the mounting board.

The first and second resistive elements may be wire-wound resistive elements having opposite winding directions.

When the first and second resistive elements are integrated with their winding directions set opposite, inductance can be set to zero. When the winding directions of the resistance wires are set opposite, the effect of setting inductance to zero can be further increased.

The first and second resistive elements may be a wire-wound resistive element and a film resistive element.

Since a plurality of elements with different characteristics are integrated, the functions of two resistors can be implemented by a single resistor, thus saving the space.

Connection lands may be arranged on the mounting board so that the first and second resistive elements are connected in series or parallel on the connection lands.

Connection of the four lead wires can be designed by patterns on the connection lands on the mount surface side.

The sheath is preferably a molded thermosetting insulating material or thermoplastic insulating material.

According to the present disclosure, a molded surface mount resistor can be mounted stably without the need for lead wires to be flattened.

DETAILED DESCRIPTION OF THE PREFERRED EMBODIMENTS

Hereinafter, a surface mount resistor in accordance with an embodiment of the present disclosure will be described in detail with reference to the drawings.

First Embodiment

Figure 1:
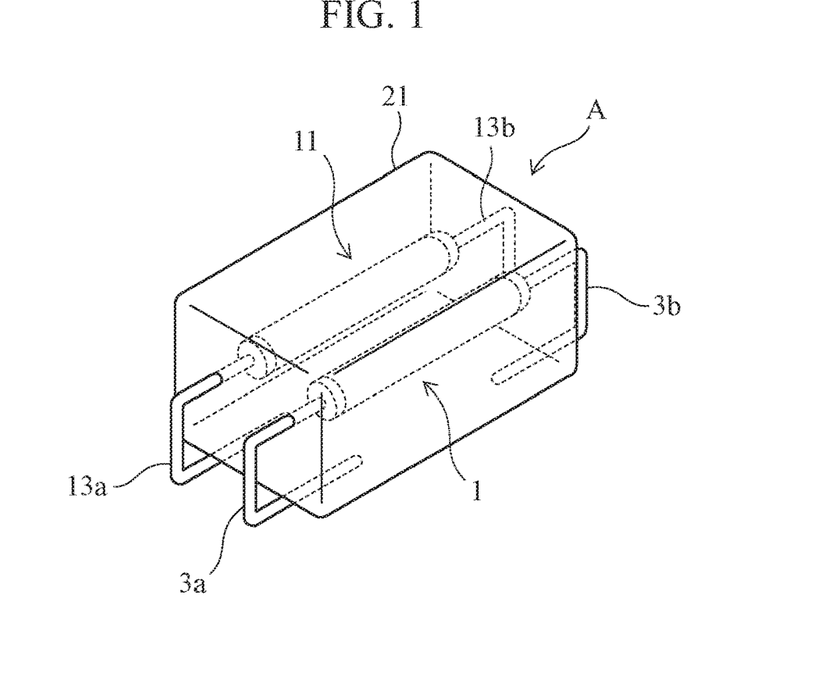
FIG. 1 is a perspective view of a surface mount resistor in accordance with a first embodiment of the present disclosure.
Figure 2:
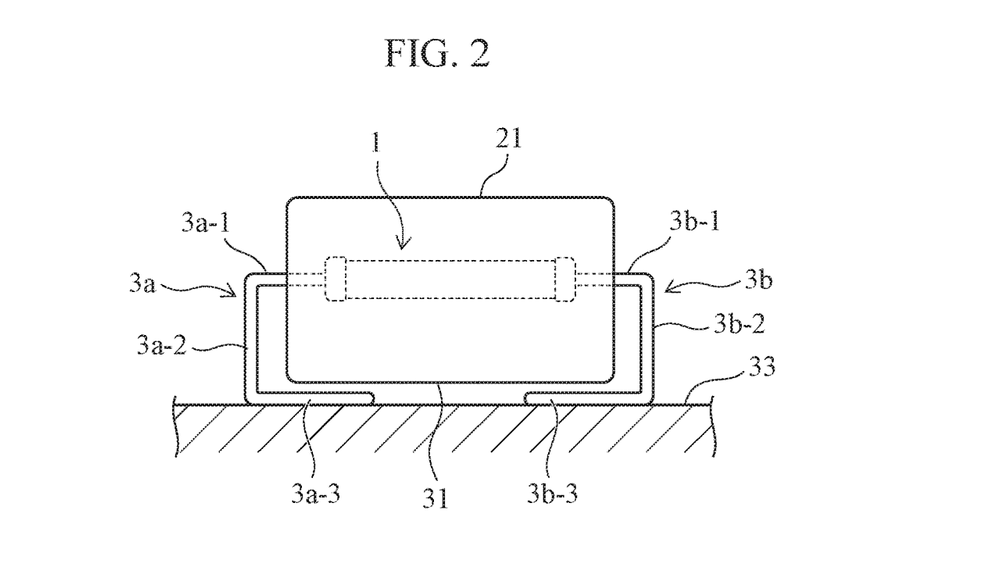
FIG. 2 is a front view of the surface mount resistor in accordance with the first embodiment of the present disclosure.
Figure 3:
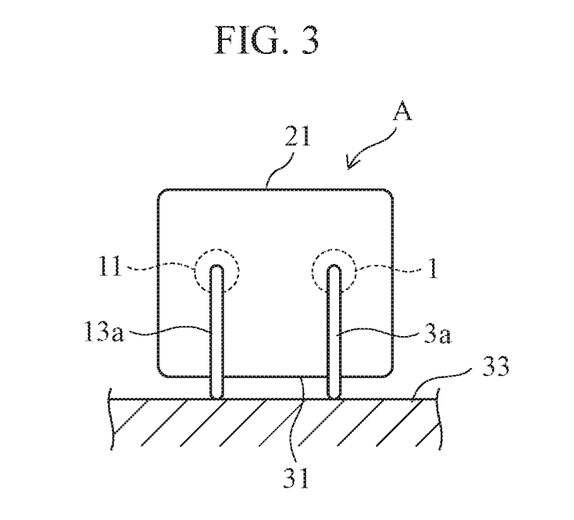
FIG. 3 is a side view of the surface mount resistor in accordance with the first embodiment of the present disclosure.

FIGS. 1 to 3 are a perspective view, a front view, and a side view, respectively, of a surface mount resistor in accordance with a first embodiment of the present disclosure.

As illustrated in FIGS. 1 to 3, a surface mount resistor A in accordance with the present embodiment has, for example, two or more resistive elements that are arranged in parallel and are integrated by being entirely covered with a sheath such as molding resin 21.

Hereinafter, a case where two resistive elements are provided will be exemplarily described. The number of elements may also be three or more. The surface mount resistor A has a first resistive element 1 and a second resistive element 11 and is fixed by the molding resin 21. The first resistive element 1 and the second resistive element 11 have lead wires (lead terminals) 3a, 3b and 13a, 13b at their opposite ends, respectively.

The lead wires 3a, 3b (first lead wires, hereinafter, the same) and 13a, 13b (second lead wires, hereinafter, the same) protrude beyond the opposite ends and are bent so as to follow the side surfaces of the molding resin 21. Next, the lead wires are bent so as to follow the bottom surface 31 side. The tip end portions of the lead wires 3a, 3b and 13a, 13b are disposed at positions opposite each other.

As illustrated in FIGS. 2 and 3, the bottom surfaces of the lead wires 3a, 3b and 13a, 13b that are bent so as to follow the bottom surface 31 side are disposed such that they are in line contact with lands on a mounting board 33, for example.

As the resistive element that forms the resistive element 1 in accordance with the present embodiment, the following element can be used, for example.

1) A film resistive element obtained by forming a metal film, a carbon film, a metal glaze film, a metal oxide film resistance film, or the like on the surface of a cylindrical insulating substrate (e.g., alumina, mullite, or forsterite).

2) A resistive element obtained by winding a resistance wire (e.g., CuNi, NiCr, FeCr, or CuMnNi) on the outer circumferential surface of a cylindrical insulating substrate or a bundle of glass fibers.

3) A resistive element made of a conductive ceramic substrate. Such a resistive element is a so-called sold resistor and is also called a ceramic resistor. For example, the resistive element is a cylindrical resistive element obtained by mixing a conductive material such as $SnO_2$ with insulating ceramic such as talc, a Ca compound, or a Ba compound, and sintering the mixture. Caps are pressed into the opposite ends of the cylinder and lead wires are welded thereto.

As described above, the resistive element in this specification is a resistive element obtained by fitting metal caps to the opposite ends of the resistive element and welding lead wires to the caps, for example.

As the resistive elements that are integrated within the mold or the case, the following combinations can be selected, for example. A case where two resistive elements are provided will be exemplarily described.

1) Example in which different types of resistive elements, such as a wire-wound resistive element and a film resistive element, are used.

Figure 4:
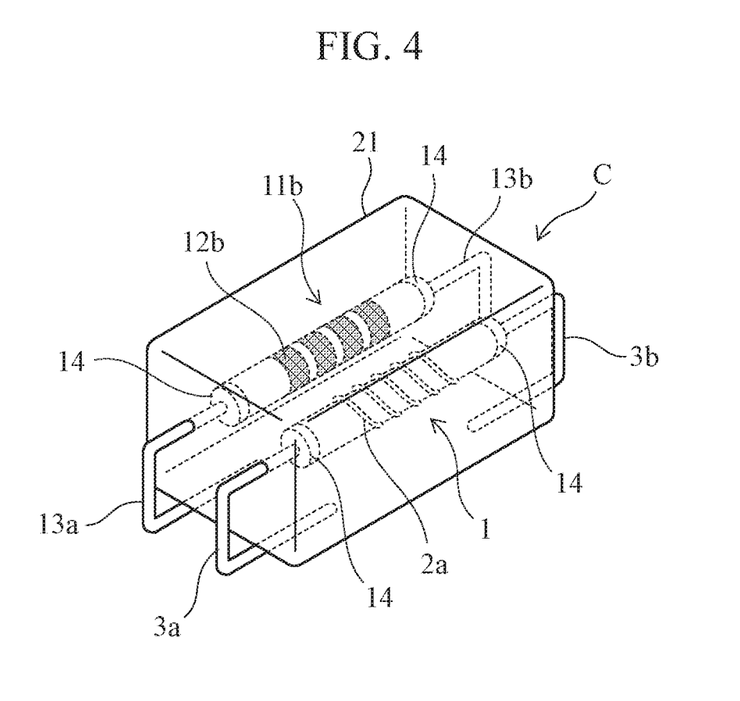
FIG. 4 is a perspective view illustrating an exemplary configuration of a surface mount resistor for which different types of resistive elements, such as a wire-wound resistive element and a film resistive element, are used.

FIG. 4 is a perspective view illustrating an exemplary configuration of such a surface mount resistor. Accordingly, it is possible to allow a single resistor to have the functions of two resistors with the use of the wire-wound resistive element and the film resistive element. Since a plurality of elements with different characteristics are integrated, the functions of two resistors can be implemented by a single resistor, thus saving the space.

2) Example in which two wire-wound resistive elements are used.

Figure 5:
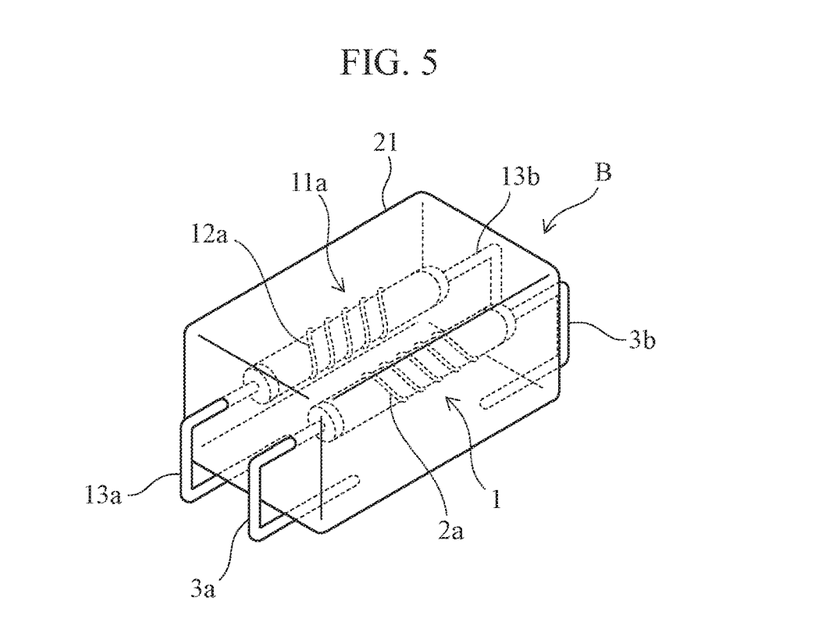
FIG. 5 is a perspective view illustrating an exemplary configuration of a surface mount resistor in which the winding directions of winding wires of wire-wound resistive elements are set opposite.

FIG. 5 is a perspective view illustrating an exemplary configuration of such a surface mount resistor. For example, the height can be reduced as compared to when a single resistive element with the same characteristics is used. In addition, connecting the resistive elements in series can increase the range of the resistance value.

Since a desired power capacity is attained by using two or more resistive elements with the same characteristics, it is possible to reduce the power of each resistive element as compared to when a single element is used as is conventional, and use resistive elements with smaller volumes. Therefore, the height can be reduced. Further, if the elements are connected in series, the range of the resistance value can be increased.

It should be noted that if the resistive elements are integrated in a state in which they are arranged in parallel with the winding directions set opposite, the inductance can be set to zero.

As illustrated in FIG. 5, a first wire-wound resistive element 1 and a second wire-wound resistive element 11a whose winding direction of a winding wire 12a is opposite to that of a winding wire 2a of the first wire-wound resistive element 1 can be arranged within single molding resin 21.

If the resistive elements are integrated with the winding directions of the winding wires set opposite, the inductance of the resulting resistor can be set to zero.

3) It is also possible to use a temperature fuse element and a wire-wound resistive element.

A temperature fuse element is a fuse of a type that will blow upon heat generation of a resistive element and thus interrupt a current flow therethrough in order to prevent failure of a device due to an abnormal temperature increase in the device, a continuous flow of overcurrent, or the like.

The resistive element may fuse due to a continuous flow of overcurrent or pulses. However, there is a possibility that the generated heat may adversely affect the neighboring components or the circuit board by the time the fuse blows.

Therefore, a fuse resistor obtained by connecting a fuse element and a resistive element in series is used. It is also possible to house a resistive element and a fuse element in a case made of an insulating material (ceramic) and having an open surface and seal the opening with an insulating material (cement). However, in the present embodiment, the fuse element and the resistive element can be integrated using a mold.

In addition, a resistor and a fuse resistor with excellent pulse characteristics can be implemented at low cost.

A pulse is a large current that flows through a circuit instantaneously. For example, for an in-vehicle component, there is a demand for surely interrupting a continuous flow of overcurrent that may possibly damage a board, in order to protect the circuit. Meanwhile, there is also a demand for a resistor (resistive element) that is strong against pulses, that is, a resistor that does not interrupt such a large instantaneous current (pulse) that will not damage a circuit.

A resistor that is strong against pulses is a resistor in which a resistive element is unlikely to become damaged even if high power is instantaneously applied thereto, and it is acceptable as long as power that is applied per unit volume of the resistive element is set low. Preferably, a resistor is used in which a resistive element has a large volume or power is not concentrated partially. For example, since a desired resistance value is attained using two or more resistive elements with the same characteristics, a resistor that is stronger against pulses can be obtained as compared to when a single resistive element is used.

4) Besides a configuration in which two resistive elements are combined, it is also possible to combine a resistive element and a metal wire (jumper wire).

Figure 6:
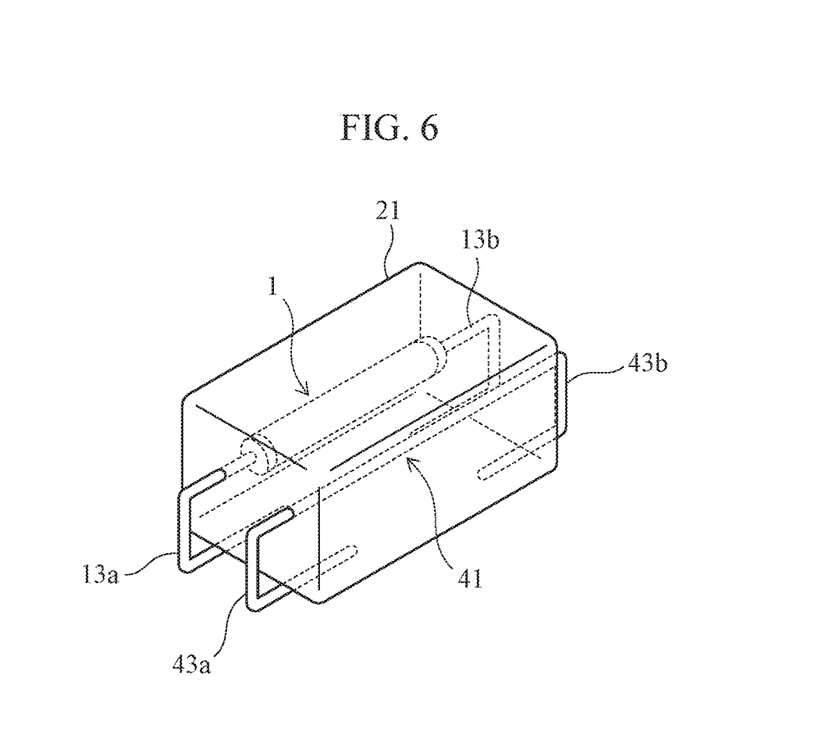
FIG. 6 is a perspective view illustrating an exemplary configuration of a surface mount resistor obtained by combining a resistive element and a metal wire (jumper wire) instead of a configuration obtained by combining two resistive elements.

As illustrated in FIG. 6, a jumper wire (jumper resistor) 41 is also called a zero-ohm resistor. The jumper wire 41 is used when a wire needs to be arranged across a circuit board or in order to short-circuit a wire between mount-land patterns when an electronic component that has been necessary in the design phase becomes no more necessary, for example. The jumper wire 41 may have a resistance value of not zero but several ten mΩ.

As illustrated in FIGS. 1 to 3 and the like, the lead wires 3a, 3b, 13a, and 13b are connected by being welded to caps that are fitted to the opposite ends of the resistive elements 1 and 11. Part of the lead wires is covered with the molding resin 21 and another part thereof is extracted to the outside of the molding resin 21. The part extracted to the outside is bent so as to form an approximately squared U-shape along the bottom surface from the side surfaces of the molding resin 21.

As a material of each lead wire, it is possible to use a material obtained by plating the surface of Cu, Fe, Al, or the like with Sn in order to improve the solder wettability of the surface during mounting.

In addition, in order to increase the mounting stability of the resistor, it is also possible to bend the lead wires toward the inner side or the outer side from the side surfaces of the molding resin 21. That is, the tip ends of the lead wires may be opened or closed.

In each of the aforementioned embodiments, the surface mount resistor in accordance with the present embodiment can be supported by at least two lead wires from the opposite ends thereof, that is, a total of lead wires when mounted. Therefore, the surface mount resistor can be stably connected to the mounting board 33.

Therefore, there is no need to use a structure for obtaining stability, such as partially squashing the lead wires. Therefore, stable mounting is possible by using the resistive elements with ordinary linear (cylindrical) leads as they are.

In addition, since the lead wires are bent twice, stress on the resistor or the mounting board 33 can be mitigated, whereby the reliability of the solder joint portions, which are the connection portions between the mounting board 33 and the lands, against thermal shocks is increased. Since the bent portions of the lead wires on the bottom surface 31 side are in contact with the solder (lands) in a rounded state, stress concentration on the solder can be mitigated. Further, since the lead wires with circular cross-sections can be used as they are, stress concentration on the solder can be mitigated.

The molding resin 21 that is the sheath is described below.

The resistive elements 1 and 11 are entirely covered with the molding resin 21 except the lead wires 3a, 3b, 13a, and 13b that are lead out from the opposite ends of the resistive elements 1 and 11.

The molding resin (sheath) 21 is formed by molding epoxy resin or the like or is formed by covering the resistive elements 1 and 11 with a case made of resin or ceramic and filling the inside of the case with a cement material or a potting resin material.

The molding resin can be formed such that its corners are roundish in accordance with the shape of the elements inside the molding resin. Accordingly, redundant molding resin at the corner portions can be reduced, and the distance of from the elements to the molding resin 21 can be reduced, whereby the radiation property of heat to the atmosphere is improved.

Second Embodiment

Next, a second embodiment of the present disclosure will be described.

Figure 7:
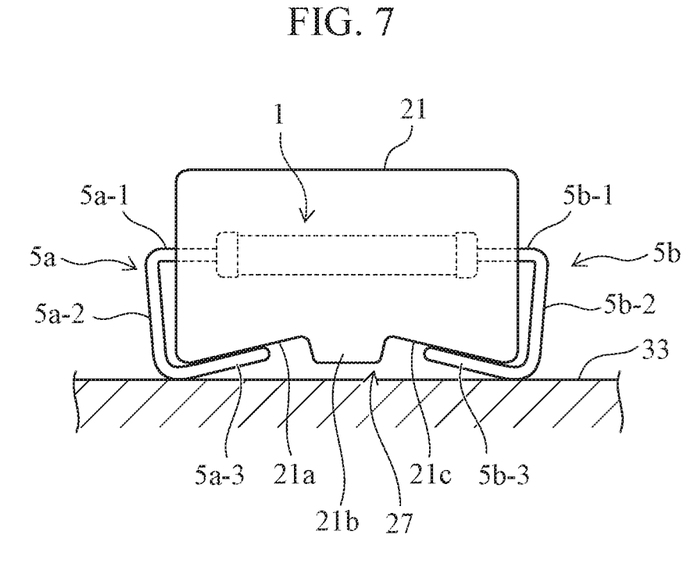
FIG. 7 is a front view illustrating an exemplary configuration of a surface mount resistive element in accordance with a second embodiment of the present disclosure.
Figure 8:
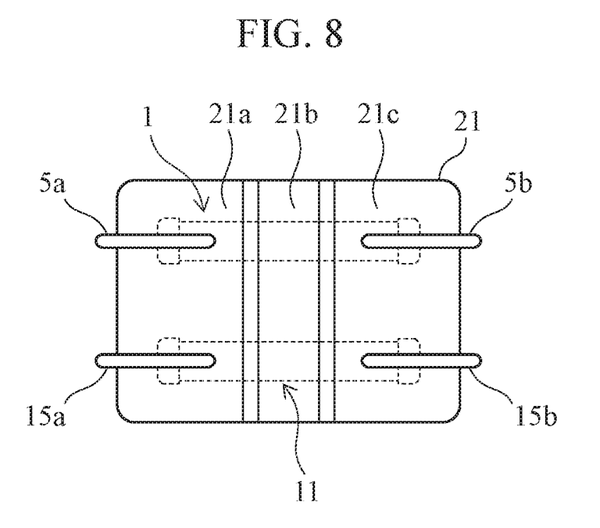
FIG. 8 is a bottom view illustrating an exemplary configuration of the surface mount resistive element in accordance with the present embodiment.
Figure 9:
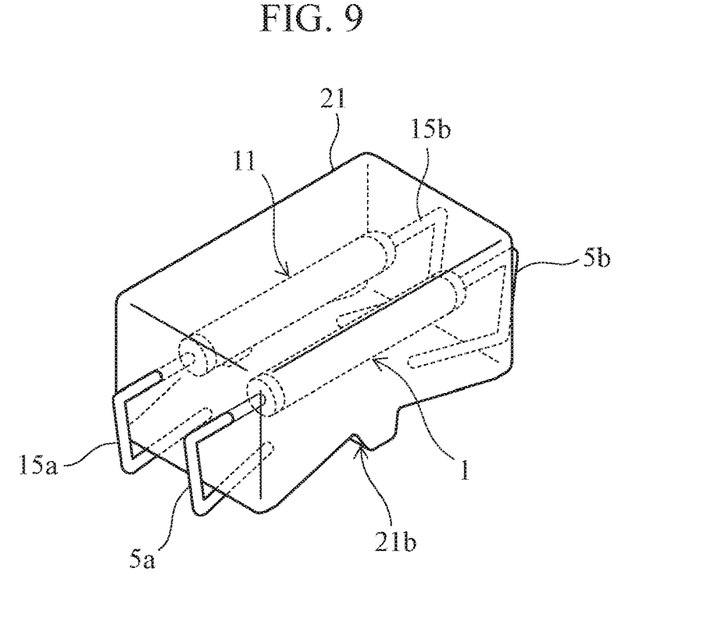
FIG. 9 is a perspective view illustrating an exemplary configuration of the surface mount resistive element in accordance with the present embodiment.

FIGS. 7, 8, and 9 are views each illustrating an exemplary configuration of a surface mount resistive element in accordance with the present embodiment. The bottom surface 31 of the molding resin 21 has formed thereon a recessed portion 27 that is recessed as a whole for housing therein lead wires 5a, 5b, 15a, and 15b that are bent.

The recessed portion 27, which serves as the lead wire housing portion, has formed thereon sloped portions 21a and 21c that are sloped toward the center, thereby allowing the lead wires 5a, 5b, 15a, and 15b to be bent more inward at acute angles.

When the slopes (recessed portion 27) are provided on the bottom surface of the mold, the lead wires 5a, 5b, 15a, and 15b can be bent more inward, that is, at angles less than right angles, and also, the lead wires can be housed in the sloped portions even when springback occurs. Therefore, there is an advantage in that floating of the lead wires is prevented.

When the sloped portions 21a and 21c are provided, the lead wires 5a, 5b, 15a, and 15b are bent inward at acute angles. Therefore, the bent portions abut the surface of the mounting board 33 and support the resistor A at points. Therefore, stable mounting is possible without the need for the lead wire 5a, 5b, 15a, or 15b to be bent at approximately right angles.

It should be noted that when the recessed portion 27 is formed on the bottom surface of the molding resin 21, a projecting portion (step) 21b may be formed at the center of the bottom surface 31. With the projecting portion 21b, the mounting stability can be increased and short-circuit between the lead wires 5a, 5b, 15a, and 15b can be prevented.

The projecting portion (step) 21b having a function of a spacer (partition) between the lead wires 5a, 5b, 15a, and 15b is preferably formed so as not to directly abut the circuit board or the like when the resistor is mounted thereon. Accordingly, even when the molding resin has expanded in the direction to push the resistor upward due to thermal stress, the resistor will not float from the circuit board or the like, and thus, stable mounting is possible.

Figure 10:
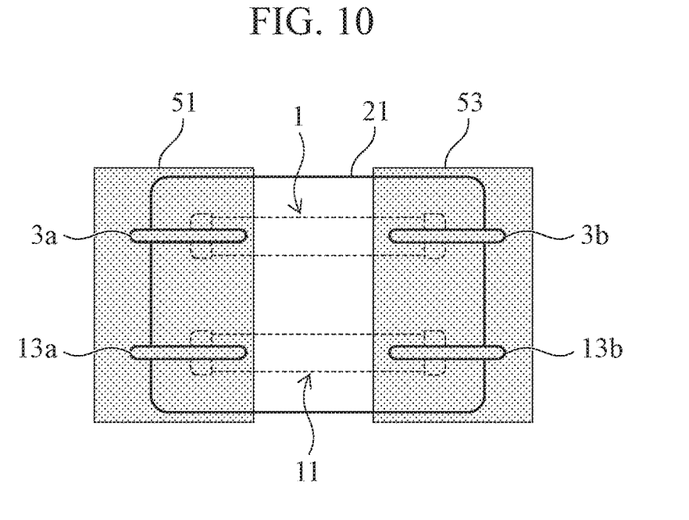
FIG. 10 is a view of a resistor in accordance with the present embodiment, which is mounted on a mounting board, as seen from the bottom surface side.
Figure 11:
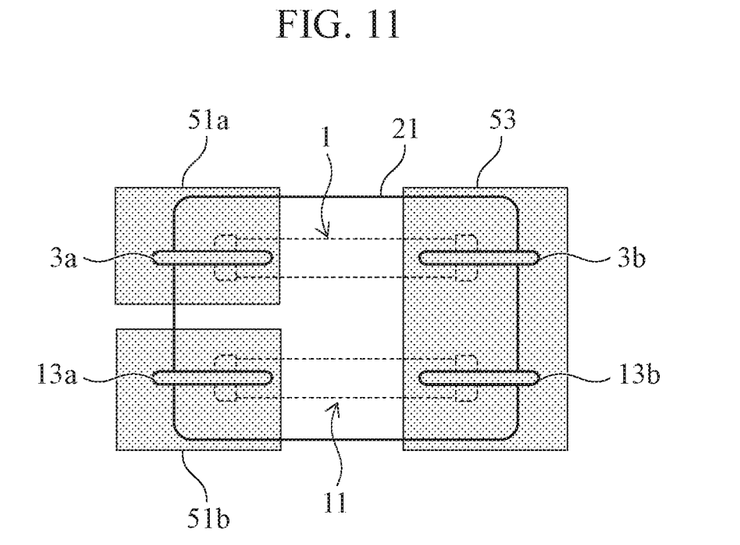
FIG. 11 is a view of a resistor in accordance with the present embodiment, which is mounted on a mounting board, as seen from the bottom surface side, and illustrates an example in which the resistor is mounted on a mount-side land different from that in FIG. 10.

FIGS. 10 and 11 are bottom views of the resistor A in accordance with the present embodiment, which is mounted on a mounting board, as seen from the mounting board side. Basically, the resistor has the same configuration as that illustrated in FIGS. 1 to 3.

Reference numerals 51, 53, 51a, and 51b indicate circuit patterns (lands) on the mounting board.

As illustrated in FIG. 10, the resistor can have, when the adjacent terminals 3a-13a and 3b-13b are mounted on the same circuit pattern (land) 51 or 53, the two resistive elements 1 and 11 connected in parallel.

Meanwhile, as illustrated in FIG. 11, if the mounted circuit patterns are changed, that is, if the land 51 is separated into lands 51a and 51b and one of the lead wires 3a and 13a is connected to one of the lands 51a and 51b, it becomes possible to change the connection to a serial connection without changing the structure of the resistor. In such a case, an increase in the component area in the lengthwise direction can be suppressed, and elements with low resistance values can be combined. Therefore, a resistor that is strong against pulses is obtained.

When circuit patterns as illustrated in FIG. 11 are formed, current will flow from the land 51a to the land 51a via the land 53. Therefore, the elements can be connected in series.

When the elements are connected in series, the combined resistance of the elements is the total resistance value. Therefore, although a single element with a desired resistance value has been used conventionally, it is acceptable in the present embodiment as long as a desired resistance value is obtained from two elements each having half the resistance value. Therefore, resistive elements with low resistance values can be combined. Accordingly, a resistor that is strong against pulses and is strong against pulses when resistive elements are connected in series can be provided.

Third Embodiment: Production Steps

Next, exemplary steps of producing a surface mount resistor C in accordance with the present embodiment will be described.

Figure 12:
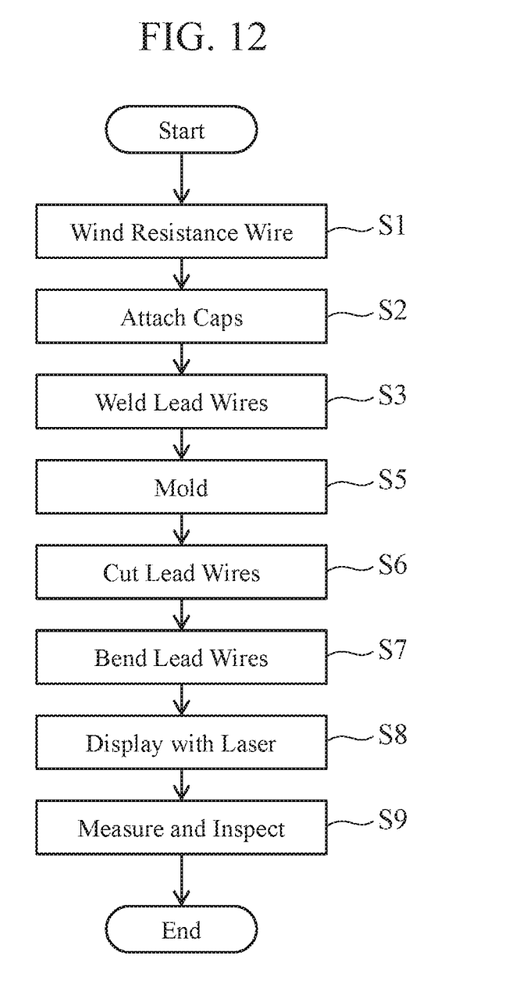
FIG. 12 is a flowchart illustrating exemplary steps of producing a surface mount resistor including two wire-wound resistive elements.
Figure 13:
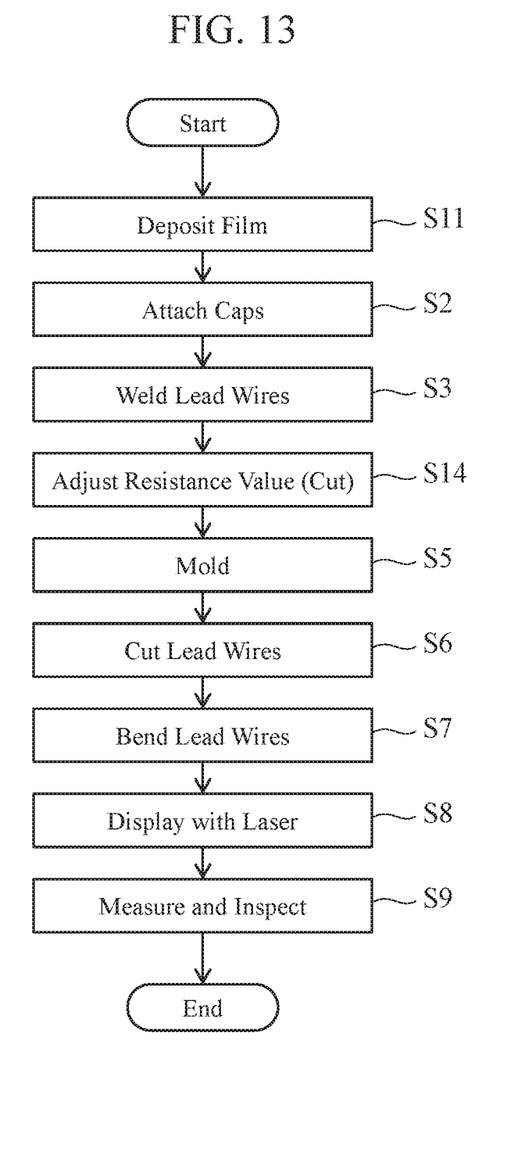
FIG. 13 is a flowchart illustrating exemplary steps of producing a surface mount resistor including two film resistive elements.

FIG. 12 is a flowchart illustrating exemplary steps of producing a surface mount resistor including wire-wound resistive elements, and FIG. 13 is a flowchart illustrating exemplary steps of producing a surface mount resistor including film resistive elements. The following description is based on FIG. 4.

As illustrated in FIG. 12, in step S1, a resistance wire 2a (e.g., NiCr wire) is wound on the outer circumferential surface of a long bar-like core formed from a bundle of glass fibers at a predetermined pitch (for example, see FIG. 4). Next, after the resistance wire 2a is wound, a long piece is obtained, which is then cut into individual pieces. The core may be a cylindrical insulating substrate such as ceramic. In step S2, metal caps (see reference numeral 14 in FIG. 4 or the like) are attached to the opposite ends through swaging or press fitting so that the wire-wound resistive element 1 is produced. The end portions of the resistance wire wound on the core are housed within the caps in attachment of the caps (step S2). The end portions of the resistance wire may also be welded to the surfaces of the caps 14.

Meanwhile, when a film resistive element is used, in step S11 illustrated in FIG. 13, a resistive element is produced by depositing a resistance film (e.g., tin oxide) on a core made of an insulating material such as ceramic, using hydrolysis or the like. In step S2, metal caps are attached to the opposite ends through swaging or press fitting. It should be noted that after the film deposition, the resistance value has variations. Therefore, in the following resistance value adjustment step (step S14), adjustment is performed by removing the resistance film, and the film resistive element 11b is thus produced.

When each of the aforementioned resistive elements is produced, linear lead wires 3a, 3b, 13a, and 13b are welded to the end surfaces of the metal caps 14 in step S3.

The order of steps S3 and S14 may be reversed. Further, a protective film may be formed on the entire surface excluding the lead wires, using epoxy resin or the like after step S3/S14.

Following step S5, a step of assembling the resistor is performed.

In the molding step in step S5, the lead wires of the resistive elements 1 and 11b produced in steps S3 and S14 are sandwiched by a mold that has been heated to a predetermined temperature, and a cylinder and a nozzle for flowing resin into the mold as well as the mold are heated, and then resin is flowed into the mold, followed by adjustment of the temperature, pressure, time, the speed of the resin, and the like.

Positioning of the resistive elements during molding is performed such that a groove for fixing the lead wires 3a, 3b, 13a, and 13b is formed in the mold in advance so that the lead wires are fixed and positioned therein.

Next, in step S6, the lead wires are cut into predetermined dimensions, and then, the lead wires are bent along the bottom surface from the side surfaces of the mold in step S7.

The order of bending is such that the lead wires are first bent into a squared U-shape, and then, portions of the lead wires adapted to abut the mounting board 33 are further bent inward.

Rating and the like are displayed on the surface of the resin using laser and the like (step S8) to produce the resistor C, and finally, inspection of an image of the appearance as well as measurement of the resistance value and the like are conducted in step S9 to complete the product.

It should be noted that the step of bending the lead wires in step S7 can be performed using a common method of bending lead wires. For example, the lead wires are bent with a jig pressed against the lead wires in a state in which the sheath portion of the mold and the lead wires are partially pressed with the mold. When the lead wires are bent with the jig pressed against the lead wires from the right and left lateral sides thereof, the lead wires are bent into a squared U-shape. Further, portions of the lead wires adapted to abut the mounting board 33 are bent inward so that the resistor is completed.

If the two resistive elements 1 and 11b are arranged at horizontal positions within the molding resin 21 when the lead wires are bent, the steps of bending the lead wires 3a, 3b, 13a, and 13b can be performed at a time. Therefore, the steps can be simplified and the bending dimensions and shapes become identical, which can improve the mounting properties.

It should be noted that when a case of ceramic or the like is used, the case of ceramic or the like is filled with an insulating material (cement) from an opening thereof instead of the molding step in step S5, and the body of the resistive element produced in steps S3/S14 is inserted into the case, and then, drying and burning are performed. It should be noted that the steps following step S6 may be the same as those described above.

When two identical resistive elements are used, the resistive elements are formed through steps S1 to S3 or S11 to S14. Then, in step S5 (molding step), the two resistive elements are integrated in a single step.

With the aforementioned configuration, a surface mount resistor in accordance with the present embodiment can be easily formed.

It should be noted that the molding resin 21 can be formed such that its corners are roundish, for example, in accordance with the shape of the resistive element 1 (1 or 11, hereinafter referred to as the "resistive element 1") within the molding resin 21. Hereinafter, such a modified example will be briefly described.

Figure 14:
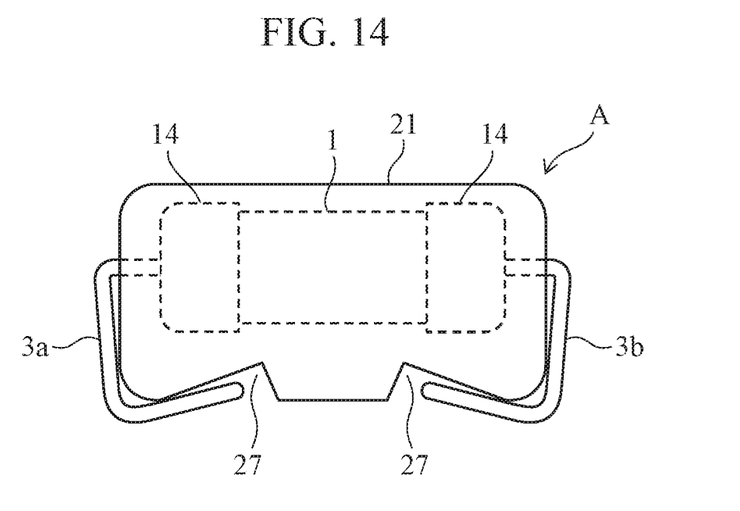
FIG. 14 is a view illustrating a modified example corresponding to FIGS. 2 and 7.
Figure 15:
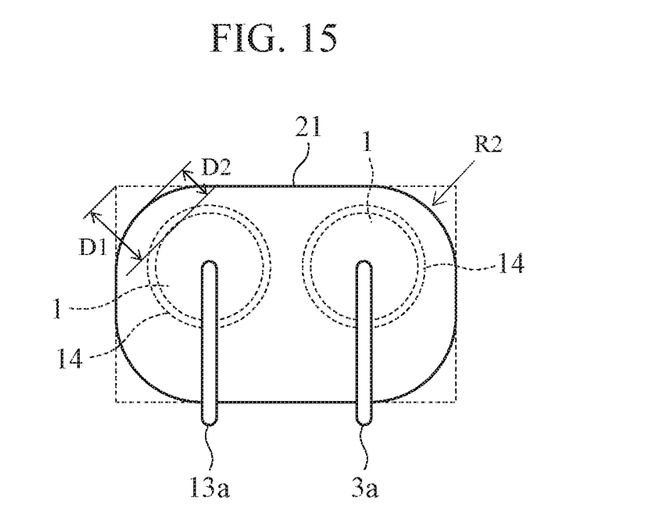
FIG. 15 is a view illustrating a modified example corresponding to FIG. 3.
Figure 16:
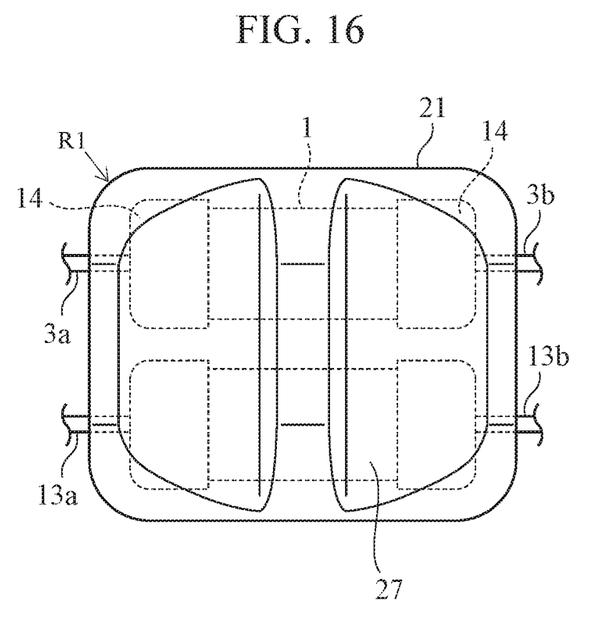
FIG. 16 is a view illustrating a modified example corresponding to FIG. 8.

FIG. 14 is a front view illustrating a modified example corresponding to FIGS. 2 and 7. FIG. 15 is a view illustrating a modified example corresponding to FIG. 3. FIG. 16 is a view illustrating a modified example corresponding to FIG. 8.

The molding resin 21 illustrated in each of FIGS. 14 to 16 has corners (R1 and R2) that are formed roundish in accordance with the shape of the resistive element 1 within the molding resin 21. Accordingly, molding resin in regions at the corners indicated by dotted lines in the side view of FIG. 15, for example, can be reduced. In addition to reducing the molding resin at the corner portions, it is also possible to reduce the distance of from the resistive element 1 to the molding resin 21, and thus improve the radiation property of heat to the atmosphere.

It should be noted that symbol R1 indicates four corners each formed by two or three planes of the top surface or the bottom surface and the side surfaces, which cross each other, and symbol R2 indicates four corners illustrated in FIG. 15.

As the corners (in particular, R2) are formed roundish, the corners of the molding resin 21 have shapes that follow the outer shape of the cylindrical resistive element 1 and/or the outer shape of the cap 14. Consequently, as illustrated in FIG. 15, the distance (D1) of from the surface of the resistive element 1 to the surface of the molding resin 21 becomes short like D2, and therefore, the radiation property of heat to the atmosphere is improved.

FIG. 16 is a bottom view.

As illustrated in FIG. 16, the molding resin 21 has four rounded corners with the corners R1 and R2 (FIG. 15) on the bottom surface. In addition, the recessed portion 27 of the molding resin 21 is sloped such that it becomes lower toward the center along the extending direction of the resistive element 1.

It should be noted that in FIGS. 15 and 16, symbol R1 indicates corners each formed by two or three planes of the top surface or the bottom surface and the side surfaces. Symbol R2 indicates corners (sides) each formed by two planes of the top surface or the bottom surface and the side surfaces.

Accordingly, the lead wires 3a, 3b, 13a, and 13b can be bent more inward, that is, at angles less than right angles, and the lead wires can be housed in the sloped portions even when springback occurs. Therefore, the lead wires are unlikely to float. Further, as the bent portions of the lead wires abut the surface of the mounting board, stable mounting is possible. It is also possible to reduce the molding resin 21 on the bottom surface portion.

In the aforementioned embodiments, the configurations and the like illustrated in the attached drawings are not limited thereto, and the configurations and the like can be changed as appropriate within the range that the advantageous effects of the present disclosure are exerted. Besides, the configurations and the like can be changed as appropriate within the scope of the object of the present disclosure.

In addition, each constituent element of the present disclosure can be freely selected, and an invention that includes the selected element(s) is also included in the present disclosure.

The present disclosure is applicable to surface mount resistors.

DESCRIPTION OF SYMBOLS

A Surface mount resistor
1 First resistive element
11 Second resistive element
3a, 3b, 5a, 5b First lead wire (lead terminal)
13a, 13b, 15a, 15b Second lead wire (lead terminal)
14 Cap
21 Molding resin (sheath)
21a, 21c Sloped portion
21b Projecting portion
27 Recessed portion
31 Bottom surface
33 Mounting board
51 Land
51a, 51b Separated lands

What is claimed is:
1. A surface mount resistor comprising:
a first resistive element and a second resistive element arranged in parallel, the first resistive element having first lead wires at opposite ends thereof, and the second resistive element having second lead wires at opposite ends thereof,
wherein:
the first resistive element and the second resistive element are integrated by molding resin that covers the first resistive element and the second resistive element,
the first lead wires and the second lead wires are arranged such that the lead wires protrude outward in a direction of an axis beyond the molding resin, and the first lead wires and the second lead wires are bent along side surfaces of the molding resin, and are further bent at positions away from a bottom surface of the molding resin in a downward direction so that each of the first resistive element and the second resistive element is connected to a surface of a mounting board via at least two lead wires led out from the opposite ends of each resistive element, that is, a total of four or more lead wires, at positions below the bottom surface of the molding resin.

2. The surface mount resistor according to claim 1, further comprising a lead wire housing portion on the bottom surface of the sheath, the lead wire housing portion being adapted to house the first lead wires and the second lead wires therein.

3. The surface mount resistor according to claim 2, wherein:

the lead wire housing portion has a sloped portion that is sloped from an end surface toward a center of the sheath, and the first lead wires and the second lead wires are bent along the sloped portion.

4. The surface mount resistor according to claim 2, wherein the first lead wires and the second lead wires are housed in the lead wire housing portion, and are connected at points to the mounting board.

5. The surface mount resistor according to claim 1, wherein the first and second resistive elements are wire-wound resistive elements having opposite winding directions.

6. The surface mount resistor according to claim 1, wherein the first and second resistive elements are a wire-wound resistive element and a film resistive element.

7. The surface mount resistor according to claim 1, wherein connection lands are arranged on the mounting board so that the first and second resistive elements are connected in series or parallel on the connection lands.

8. The surface mount resistor according to claim 1, wherein the sheath is a molded thermosetting insulating material.

* * * * *